United States Patent
Terashita (10) Patent No.: US 10,242,797 B2
(45) Date of Patent: Mar. 26, 2019

(54) MULTILAYER-CERAMIC-CAPACITOR MOUNTING STRUCTURE

(71) Applicant: Murata Manufacturing Co., Ltd., Nagaokakyo-shi, Kyoto-fu (JP)

(72) Inventor: Yosuke Terashita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/482,836

(22) Filed: Apr. 10, 2017

(65) Prior Publication Data
US 2017/0301464 A1 Oct. 19, 2017

(30) Foreign Application Priority Data
Apr. 14, 2016 (JP) .................. 2016-080970

(51) Int. Cl.
| | |
|---|---|
| *H01G 4/008* | (2006.01) |
| *H01G 4/12* | (2006.01) |
| *H01G 4/248* | (2006.01) |
| *H01G 4/30* | (2006.01) |
| *H05K 1/09* | (2006.01) |
| *H05K 1/11* | (2006.01) |

(Continued)

(52) U.S. Cl.
CPC ............... *H01G 4/008* (2013.01); *H01G 4/12* (2013.01); *H01G 4/248* (2013.01); *H01G 4/30* (2013.01); *H05K 1/09* (2013.01); *H05K 1/11* (2013.01); *H05K 1/181* (2013.01); *H05K 3/3442* (2013.01); *H05K 2201/10015* (2013.01); *H05K 2201/1028* (2013.01); *H05K 2201/10636* (2013.01); *Y02P 70/611* (2015.11); *Y02P 70/613* (2015.11)

(58) Field of Classification Search
CPC .......... H01G 2/065; H01G 4/008; H01G 4/12; H01G 4/012; H01G 4/248; H01G 4/30; H01G 4/232; H05K 1/09; H05K 1/11; H05K 1/181; H05K 1/0306; H05K 3/0067; H05K 3/3442; H05K 2201/10015; H05K 2201/1028; H05K 2201/10636; Y02P 70/611; Y02P 70/613
USPC .............................. 174/257, 260; 361/301.4
See application file for complete search history.

(56) References Cited

U.S. PATENT DOCUMENTS

| | | | |
|---|---|---|---|
| 6,285,079 B1 * | 9/2001 | Kunikiyo | ............ H01L 23/3114 257/737 |
| 2011/0024175 A1 | 2/2011 | Satou | |
| 2011/0051314 A1 | 3/2011 | Sakurai et al. | |

(Continued)

FOREIGN PATENT DOCUMENTS

| | | |
|---|---|---|
| JP | 11-162771 A | 6/1999 |
| JP | 2011-049515 A | 3/2011 |
| JP | 2011-054642 A | 3/2011 |

*Primary Examiner* — Timothy J Thompson
*Assistant Examiner* — Guillermo J Egoavil
(74) *Attorney, Agent, or Firm* — Keating & Bennett, LLP (57) ABSTRACT

A multilayer-ceramic-capacitor mounting structure includes a circuit board and a multilayer ceramic capacitor. First and second external electrodes include first and second conductive resin layers on surfaces of first and second base electrode layers, respectively. The circuit board includes a copper plate on a surface of a core, disposed as a wiring pattern, and including a predetermined thickness, and signal electrodes disposed on a surface of the copper plate. The first and second external electrodes are each electrically connected to the signal electrodes of the copper plate.

12 Claims, 5 Drawing Sheets

(51) Int. Cl.
*H05K 1/18* (2006.01)
*H05K 3/34* (2006.01)

(56) References Cited

U.S. PATENT DOCUMENTS

| 2015/0131253 A1* | 5/2015 | Park | H01G 2/06 |
| | | | 361/782 |
| 2015/0380387 A1* | 12/2015 | Ben Jamaa | H01L 25/50 |
| | | | 257/713 |
| 2016/0211074 A1* | 7/2016 | Gu | H01G 2/065 |
| 2017/0250026 A1* | 8/2017 | Mizuno | H01G 4/012 |

\* cited by examiner

MULTILAYER-CERAMIC-CAPACITOR MOUNTING STRUCTURE

CROSS REFERENCE TO RELATED APPLICATIONS

This application claims the benefit of priority to Japanese Patent Application No. 2016-080970 filed on Apr. 14, 2016. The entire contents of this application are hereby incorporated herein by reference.

BACKGROUND OF THE INVENTION

1. Field of the Invention

The present invention relates to a multilayer-ceramic-capacitor mounting structure, and particularly relates to a multilayer-ceramic-capacitor mounting structure including a circuit board and a multilayer ceramic capacitor mounted on the circuit board.

2. Description of the Related Art

A multilayer ceramic capacitor is used in various kinds of electronic devices, and typically includes a laminated body in which a plurality of ceramic layers and a plurality of internal electrode layers are alternately laminated, and a pair of external electrodes disposed on a surface of the laminated body. Recently, the severity of environments in which the multilayer ceramic capacitor is used has increased. Thus, the multilayer ceramic capacitor is required to withstand such usage. For example, a multilayer ceramic capacitor used in a mobile device such as a cellular phone or a portable music player is required to prevent the generation of cracks and maintain connection with the circuit board when an impact occurs when the device falls. A multilayer ceramic capacitor used in an on-board instrument such as an electronic control unit (ECU) is required to prevent the generation of cracks when distortion stress caused by thermal contraction and thermal expansion of the circuit board and when tensile stress is applied to the external electrodes, and to include thermal resistance, for example. When an applied distortion stress or tensile stress exceeds the strength of the laminated body, cracks are generated in the laminated body.

Japanese Patent Application Laid-Open No. 11-162771 discloses a technology intended to reduce the generation of cracks in a multilayer ceramic capacitor used in a severe environment.

The multilayer ceramic capacitor in Japanese Patent Application Laid-Open No. 11-162771 is provided with an external electrode including a baked electrode layer, a nickel-plated layer, and a conductive epoxy-based thermosetting resin layer containing metal powder and formed between the baked electrode layer and the nickel-plated layer.

As described above, in the multilayer ceramic capacitor in Japanese Patent Application Laid-Open No. 11-162771, the external electrode includes the conductive epoxy-based thermosetting resin layer containing metal powder, but stress applied from a circuit board is not sufficiently relaxed, and thus cracks are generated.

SUMMARY OF THE INVENTION

Preferred embodiments of the present invention provide a multilayer-ceramic-capacitor mounting structure that significantly reduces or prevents the generation of cracks.

A multilayer-ceramic-capacitor mounting structure according to a preferred embodiment of the present invention includes a circuit board and a multilayer ceramic capacitor mounted on the circuit board. The multilayer ceramic capacitor includes: a laminated body including a rectangular parallelepiped or substantially rectangular parallelepiped shape in which a plurality of ceramic layers and a plurality of internal electrode layers are laminated, a pair of principal surfaces facing each other in a lamination direction of the laminated body, a pair of side surfaces facing each other in a width direction perpendicular or substantially perpendicular to the lamination direction, and a pair of end surfaces facing each other in a length direction perpendicular or substantially perpendicular to the lamination direction and the width direction; and a pair of external electrodes disposed on a surface of the laminated body and electrically connected to the plurality of internal electrode layers. The pair of external electrodes each include a base electrode layer including a conductive metal and a glass component, a conductive resin layer disposed on a surface of the base electrode layer and including a thermosetting resin and a metal component, and a plated layer disposed on a surface of the conductive resin layer. The circuit board includes: a core with a flat or substantially flat plate shape; a copper plate disposed on a surface of the core to define a wiring pattern and including a predetermined thickness; and signal electrodes disposed on a surface of the copper plate. The pair of external electrodes of the multilayer ceramic capacitor are each electrically connected to the signal electrodes of the copper plate.

Preferably, the pair of external electrodes of the multilayer ceramic capacitor are each connected to the signal electrodes of the copper plate through a junction material.

Preferably, the predetermined thickness is no less than about 80 µm and no more than about 600 µm, for example.

According to preferred embodiments of the present invention, multilayer-ceramic-capacitor mounting structures that significantly reduce or prevent the generation of cracks are provided.

The above and other elements, features, steps, characteristics and advantages of the present invention will become more apparent from the following detailed description of the preferred embodiment with reference to the attached drawings.

DETAILED DESCRIPTION OF THE PREFERRED EMBODIMENT

Figure 1:
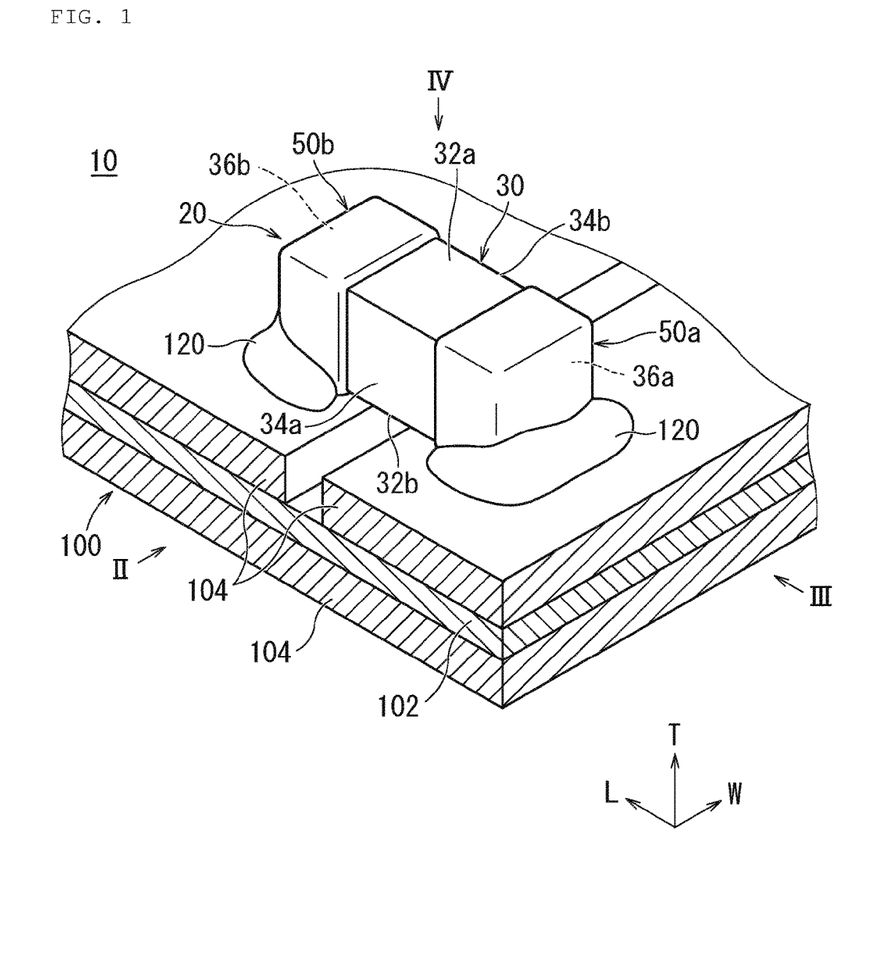
FIG. 1 is an external perspective view illustrating a multilayer-ceramic-capacitor mounting structure according to a preferred embodiment of the present invention.
Figure 2:
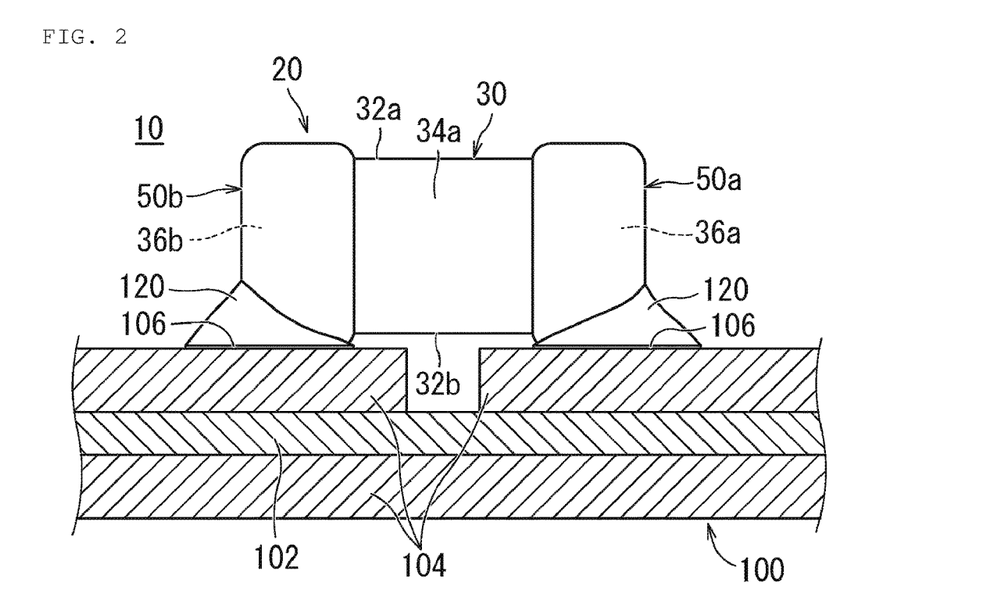
FIG. 2 is a side view illustrating a multilayer-ceramic-capacitor mounting structure according to a preferred embodiment of the present invention.
Figure 3:
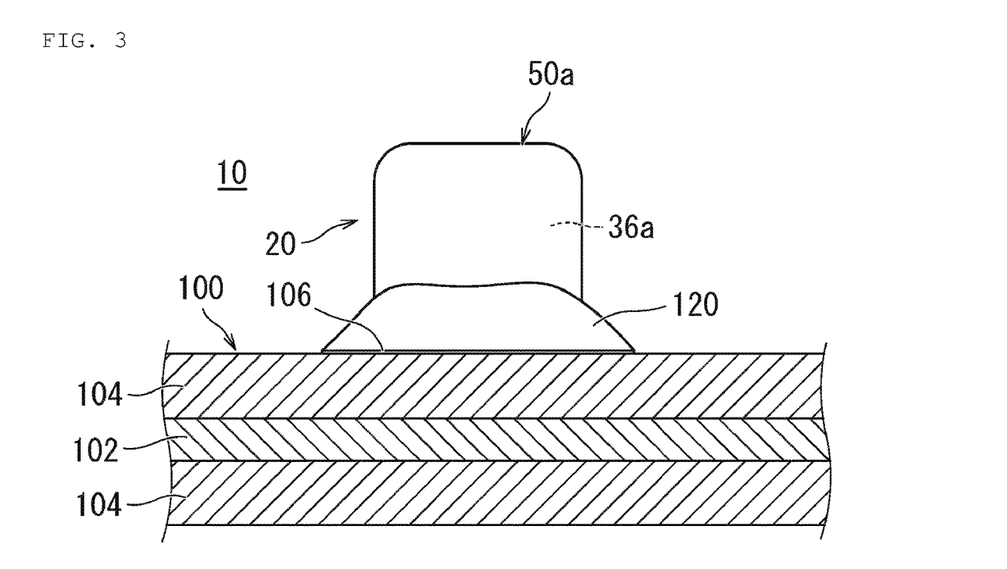
FIG. 3 is an end surface diagram illustrating a multilayer-ceramic-capacitor mounting structure according to a preferred embodiment of the present invention.
Figure 4:
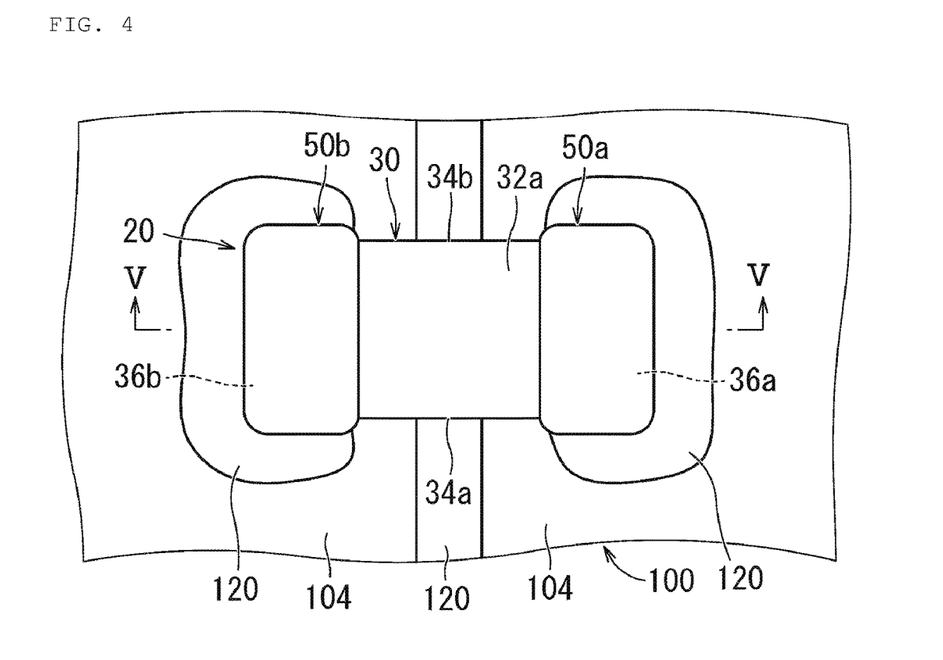
FIG. 4 is a plan view illustrating a multilayer-ceramic-capacitor mounting structure according to a preferred embodiment of the present invention.
Figure 5:
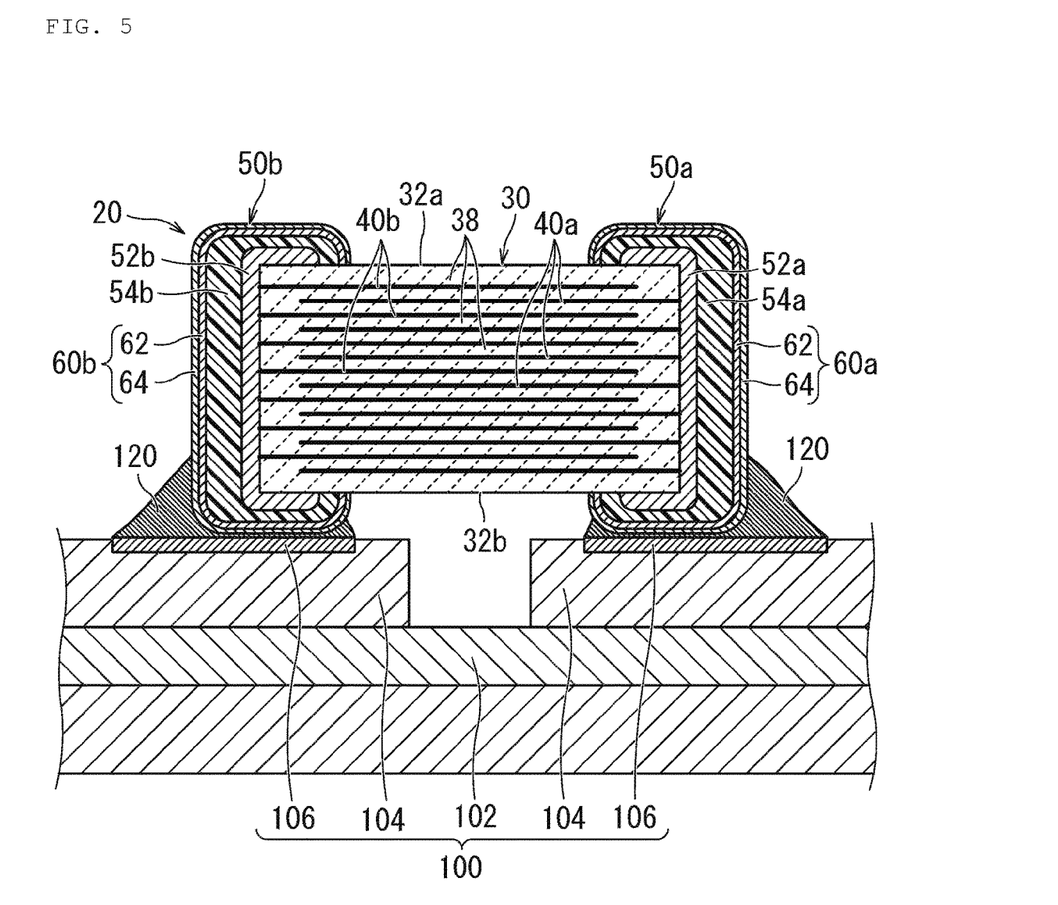
FIG. 5 is a cross-sectional view taken along line V-V in FIG. 4, illustrating a multilayer-ceramic-capacitor mounting structure according to a preferred embodiment of the present invention.

The following describes multilayer-ceramic-capacitor mounting structures according to preferred embodiments of the present invention with reference to FIGS. 1 to 5. FIG. 1 is an external perspective view illustrating a multilayer-ceramic-capacitor mounting structure according to a preferred embodiment of the present invention. FIG. 2 is a side view illustrating a multilayer-ceramic-capacitor mounting structure according to a preferred embodiment of the present invention. FIG. 3 is an end surface diagram illustrating a multilayer-ceramic-capacitor mounting structure according to a preferred embodiment of the present invention. FIG. 4 is a plan view illustrating a multilayer-ceramic-capacitor mounting structure according to a preferred embodiment of the present invention. FIG. 5 is a cross-sectional view taken along line V-V in FIG. 4, illustrating a multilayer-ceramic-capacitor mounting structure according to a preferred embodiment of the present invention.

A mounting structure 10 of a multilayer ceramic capacitor according to the present preferred embodiment includes a multilayer ceramic capacitor 20 and a circuit board 100 on which the multilayer ceramic capacitor 20 is mounted.

The multilayer ceramic capacitor 20 according to the present preferred embodiment includes a laminated body 30, and a first external electrode 50a and a second external electrode 50b (a pair of external electrodes) that are disposed on a surface of the laminated body 30.

The laminated body 30 preferably has a rectangular parallelepiped or substantially rectangular parallelepiped shape in which a plurality of ceramic layers 38, a plurality of first internal electrode layers 40a, and a plurality of second internal electrode layers 40b are laminated. Specifically, the laminated body 30 includes a first principal surface 32a and a second principal surface 32b (a pair of principal surfaces) facing each other in a lamination direction (hereinafter referred to as a "T direction"), a first side surface 34a and a second side surface 34b (a pair of side surfaces) facing each other in a width direction (hereinafter referred to as a "W direction") perpendicular or substantially perpendicular to the T direction, and a first end surface 36a and a second end surface 36b (a pair of end surfaces) facing each other in a length direction (hereinafter referred to as an "L direction") perpendicular or substantially perpendicular to the T direction and the W direction. The laminated body 30 preferably includes rounded or substantially rounded corners and edges. A portion or all of each of the first principal surface 32a, the second principal surface 32b, the first side surface 34a, the second side surface 34b, the first end surface 36a, and the second end surface 36b may be uneven.

The ceramic layers 38 are laminated in the T direction, and are interposed between the corresponding first and second internal electrode layers 40a and 40b. The ceramic layers 38 include a dielectric ceramic material including a primary component such as $BaTiO_3$, $CaTiO_3$, $SrTiO_3$, or $CaZrO_3$ and an accessory component such as a Mn compound, a Fe compound, a Cr compound, a Co compound, or a Ni compound that is added to the primary component. The thickness of the ceramic layers 38 is preferably no less than about 0.5 µm and no more than about 10 µm, for example.

Each of the first internal electrode layers 40a extends in a flat or substantially flat plate shape on a surface of the corresponding ceramic layer 38, and includes an end exposed on the first end surface 36a of the laminated body 30. Each of the second internal electrode layers 40b extends in a flat or substantially flat plate shape on a surface of the corresponding ceramic layer 38, facing the corresponding first internal electrode layer 40a with the corresponding ceramic layer 38 interposed therebetween, and includes an end exposed on the second end surface 36b of the laminated body 30. Thus, each of the first internal electrode layers 40a includes an opposing portion facing the corresponding second internal electrode layer 40b with the corresponding ceramic layer 38 interposed therebetween, and an extended portion that extends to the first end surface 36a. Similarly, each of the second internal electrode layers 40b includes an opposing portion facing to the corresponding first internal electrode layer 40a with the corresponding ceramic layer 38 interposed therebetween, and an extended portion that extends to the second end surface 36b. Capacitance is provided by the opposing portions of the first internal electrode layers 40a and the opposing portions of the second internal electrode layers 40b facing each other with the ceramic layers 38 interposed therebetween. The first internal electrode layers 40a and the second internal electrode layers 40b are preferably made of an appropriate conductive material that is a metal such as Ni, Cu, Ag, Pd, Au, or an alloy (for example, Ag—Pd alloy) including at least one of these metals, for example. The thickness of each of the first internal electrode layers 40a and each of the second internal electrode layers 40b is preferably, for example, no less than about 0.2 µm and no more than about 2.0 µm.

The first external electrode 50a is disposed on the first end surface 36a of the laminated body 30 and electrically connected to the first internal electrode layers 40a, and extends from the first end surface 36a to portions of the first principal surface 32a, the second principal surface 32b, the first side surface 34a, and the second side surface 34b. Alternatively, the first external electrode 50a is disposed only on the first end surface 36a of the laminated body 30. The second external electrode 50b is disposed on the second end surface 36b of the laminated body 30 and electrically connected to the second internal electrode layers 40b, and extends from the second end surface 36b to portions of the first principal surface 32a, the second principal surface 32b, the first side surface 34a, and the second side surface 34b. Alternatively, the second external electrode 50b is disposed only on the second end surface 36b of the laminated body 30.

The first external electrode 50a includes a first base electrode layer 52a, a first conductive resin layer 54a disposed on a surface of the first base electrode layer 52a to cover the first base electrode layer 52a, and a first plated layer 60a disposed on a surface of the first conductive resin layer 54a to cover the first conductive resin layer 54a. Similarly, the second external electrode 50b includes a second base electrode layer 52b, a second conductive resin layer 54b disposed on a surface of the second base electrode layer 52b to cover the second base electrode layer 52b, and a second plated layer 60b disposed on a surface of the second conductive resin layer 54b to cover the second conductive resin layer 54b.

The first base electrode layer 52a is disposed on a surface of the first end surface 36a of the laminated body 30 to cover the first end surface 36a, and extends to portions of the first principal surface 32a, the second principal surface 32b, the first side surface 34a, and the second side surface 34b. Alternatively, the first base electrode layer 52a is disposed only on the first end surface 36a of the laminated body 30. The second base electrode layer 52b is disposed on a surface of the second end surface 36b of the laminated body 30 to cover the second end surface 36b, and extends to portions of the first principal surface 32a, the second principal surface 32b, the first side surface 34a, and the second side surface 34b. Alternatively, the second base electrode layer 52b is disposed only on the second end surface 36b of the laminated body 30. The thicknesses of thickest portions of the first base electrode layer 52a and the second base electrode layer 52b are preferably no less than about 10 μm and no more than about 50 μm, for example.

The first base electrode layer 52a and the second base electrode layer 52b each include a conductive metal and a glass component. The conductive metal includes, for example, Cu, Ni, Ag, Pd, Ag—Pd alloy, or Au. The glass component includes, for example, glass including B, Si, Ba, Mg, Al, or Li. The first base electrode layer 52a and the second base electrode layer 52b are preferably formed by, for example, the application and baking of a conductive paste including the conductive metal and the glass component on the surface of the laminated body 30, or formed by simultaneously firing the first base electrode layer 52a and the second base electrode layer 52b with the first internal electrode layers 40a and the second internal electrode layers 40b.

The first conductive resin layer 54a is disposed on the surface of the first base electrode layer 52a that is disposed on the first end surface 36a of the laminated body 30 to cover the first base electrode layer 52a, and extends onto the surface of the first base electrode layer 52a disposed on the first principal surface 32a, the second principal surface 32b, the first side surface 34a, and the second side surface 34b to cover the first base electrode layer 52a. Alternatively, the first conductive resin layer 54a is disposed on the surface of the first base electrode layer 52a that is disposed only on the first end surface 36a of the laminated body 30 to cover the first base electrode layer 52a. The second conductive resin layer 54b is disposed on the surface of the second base electrode layer 52b that is disposed on the second end surface 36b of the laminated body 30 to cover the second base electrode layer 52b, and extends onto the surface of the second base electrode layer 52b disposed on the first principal surface 32a, the second principal surface 32b, the first side surface 34a, and the second side surface 34b to cover the second base electrode layer 52b. Alternatively, the second conductive resin layer 54b is disposed on the surface of the second base electrode layer 52b that is disposed only on the second end surface 36b of the laminated body 30 to cover the second base electrode layer 52b.

The thickness of each of the first conductive resin layer 54a and the second conductive resin layer 54b is preferably no less than about 10 μm and no more than about 150 μm, for example.

The first conductive resin layer 54a and the second conductive resin layer 54b each include a thermosetting resin and a metal component. The first conductive resin layer 54a and the second conductive resin layer 54b are each significantly more flexible due to the included thermosetting resin than a conductive layer made of, for example, a plated film or a product of fired conductive paste. With this configuration, the first conductive resin layer 54a and the second conductive resin layer 54b each define and function as a buffer layer when a physical impact or an impact due to a thermal cycle is applied to the multilayer ceramic capacitor 20. The metal component is included in each of the first conductive resin layer 54a and the second conductive resin layer 54b to provide electrical conductivity. Specifically, an electrically conductive path is provided inside of the conductive resin layer 54 by metal powders (conductive fillers) that are in contact with each other in each of the first conductive resin layer 54a and the second conductive resin layer 54b.

The thermosetting resin included in each of the first conductive resin layer 54a and the second conductive resin layer 54b is preferably an epoxy resin, which is excellent in, for example, thermal resistance, moisture resistance, and adhesiveness.

Alternatively, the thermosetting resin is another well-known resin such as phenol resin, urethane resin, silicone resin, or polyimide resin, for example. The first conductive resin layer 54a and the second conductive resin layer 54b each preferably further includes a curing agent with the thermosetting resin. The curing agent is a well-known compound such as a phenol compound, an amine compound, an acid anhydride compound, or an imidazole compound, for example, when the thermosetting resin, used as a base material, is an epoxy resin. The thermosetting resin is preferably no less than about 25 vol % and no more than about 65 vol %, for example, of the entire volume of each of the first conductive resin layer 54a and the second conductive resin layer 54b.

The metal component included in each of the first conductive resin layer 54a and the second conductive resin layer 54b is at least one of Ag, Cu, or an alloy of these materials. Ag is preferable as an electrode material because of its lowest specific resistance among metals, it does not oxidize due to being a noble metal, and it includes a high resistance to oxidation.

Thus, Ag is preferable as the metal component included in each of the first conductive resin layer 54a and the second conductive resin layer 54b. Further, an Ag coated metal powder is preferably used as the metal component. In this configuration, Cu or Ni is preferably used as the metal powder. The Cu material is provided with an anti-oxidation treatment. The use of the Ag coated metal powder allows a significant reduction in the cost of the metal powder while maintaining the characteristics of Ag. The shape of the metal powder included in each of the first conductive resin layer 54a and the second conductive resin layer 54b is preferably a mix of a spherical or substantially spherical metal powder and a flat or substantially flat metal powder, but the present preferred embodiment is not particularly limited thereto. An average particle size of the metal powder is, for example, no less than about 0.3 μm and no more than about 10 μm, for example, but is not particularly limited thereto.

The metal component is preferably no less than about 35 vol % and no more than about 75 vol %, for example, of the entire volume of each of the first conductive resin layer 54a and the second conductive resin layer 54b.

The first plated layer 60a is disposed on the surface of the first conductive resin layer 54a that is disposed on the first end surface 36a of the laminated body 30 to cover the first conductive resin layer 54a, and extends onto the surface of the first conductive resin layer 54a that is disposed on the first principal surface 32a, the second principal surface 32b, the first side surface 34a, and the second side surface 34b to cover the first conductive resin layer 54a. Alternatively, the first plated layer 60a is disposed on the surface of the first conductive resin layer 54a that is disposed only on the first end surface 36a of the laminated body 30 to cover the first conductive resin layer 54a. The second plated layer 60b is disposed on the surface of the second conductive resin layer 54b that is disposed on the second end surface 36b of the laminated body 30 to cover the second conductive resin layer 54b, and extends onto the surface of the second conductive resin layer 54b that is disposed on the first principal surface 32a, the second principal surface 32b, the first side surface 34a, and the second side surface 34b to cover the second conductive resin layer 54b. Alternatively, the second plated layer 60b is disposed on the surface of the second conductive resin layer 54b that is disposed only on the second end surface 36b of the laminated body 30 to cover the second conductive resin layer 54b.

The first plated layer 60a and the second plated layer 60b each include at least one of, for example, Cu, Ni, Sn, Ag, Pd, Ag—Pd alloy, and Au.

The first plated layer 60a and the second plated layer 60b each preferably include a double-layer structure including a Ni plated layer 62 and a Sn plated layer 64.

The Ni plated layer 62 of the first plated layer 60a is disposed on the surface of the first conductive resin layer 54a to cover the first conductive resin layer 54a. The Sn plated layer 64 of the first plated layer 60a is disposed on a surface of the Ni plated layer 62 to cover the Ni plated layer 62. The Ni plated layer 62 of the second plated layer 60b is disposed on the surface of the second conductive resin layer 54b to cover the second conductive resin layer 54b. The Sn plated layer 64 of the second plated layer 60b is disposed on a surface of the Ni plated layer 62 to cover the Ni plated layer 62.

The Ni plated layer 62 significantly increases a solder barrier property of the first external electrode 50a and the second external electrode 50b. The Sn plated layer 64 significantly increases solder wettability of the first external electrode 50a and the second external electrode 50b, which significantly simplifies mounting the multilayer ceramic capacitor 20 on the circuit board 100.

The first plated layer 60a and the second plated layer 60b may each preferably include a single-layer structure, or a multi-layer structure including three layers or more, for example. The thickness of each layer included in each of the first plated layer 60a and the second plated layer 60b is preferably no less than about 1 μm and no more than about 15 μm, for example.

The circuit board 100 includes a core 102 preferably with a flat or substantially flat plate shape, a copper plate 104 disposed on a surface of the core 102, and a signal electrode 106 disposed on a surface of the copper plate 104.

The core 102 includes, for example, a glass epoxy substrate preferably formed through impregnation of an epoxy resin into a base material that is a mixture of a glass fabric (glass cloth) and a nonwoven glass fabric. The thickness of the core 102 is preferably no less than about 200 μm and no more than about 800 μm, for example.

The copper plate 104 is disposed on each of two opposed surfaces of the core 102, and is disposed as a wiring pattern. Thus, the circuit board 100 according to the present preferred embodiment includes at least two copper plates 104. The copper plate 104 includes a portion closer to the first external electrode 50a and a portion closer to the second external electrode 50b on the surface of the circuit board 100 on which the multilayer ceramic capacitor 20 is mounted to substantially reduce or eliminate the occurrence of short-circuits. Alternatively, the circuit board 100 includes the copper plate 104 only on the surface of the circuit board 100 on which the multilayer ceramic capacitor 20 is mounted.

The copper plates 104 each include a predetermined thickness. The predetermined thickness of each copper plate 104 is configured such that, in a thermal impact cycle, stresses applied to the multilayer ceramic capacitor 20 due to a difference between linear expansion coefficients of the laminated body 30 and the circuit board 100 are significantly reduced by being absorbed or substantially absorbed by the first external electrode 50a and the second external electrode 50b that each include significantly increased elasticity. This predetermined thickness is preferably no less than about 80 μm and no more than about 600 μm, for example.

The signal electrodes 106 are exposed on the surface of the copper plate 104. The signal electrodes 106 are typically formed by plating, and preferably include Cu, which is the same as the material of the copper plate 104.

The mounting structure 10 of the multilayer ceramic capacitor according to the present preferred embodiment is achieved through electrical connection between each of the first external electrode 50a and the second external electrode 50b included in the multilayer ceramic capacitor 20 and the signal electrodes 106 of the copper plate 104. This connection is achieved by using a junction material 120 such as solder, for example. The junction material 120 preferably includes, for example, Sn, Ag, Cu, Pb, Sb, or Bi.

In a conventional technology, stress due to a difference between linear expansion coefficients of a laminated body and a circuit board is somewhat absorbed by elastic external electrodes to somewhat reduce the generation of cracks in a multilayer ceramic capacitor. However, the generation of cracks in the multilayer ceramic capacitor is insufficiently reduced with this technology due to residual stress generated when mounting the multilayer ceramic capacitor on the circuit board. A more specific description is as follows. A glass epoxy substrate as an exemplary circuit board includes a linear expansion coefficient of approximately 60 ppm/K at an actual use temperature, but is approximately 300 ppm/K at a temperature exceeding a glass-transition temperature (typically, about 130° C.). The multilayer ceramic capacitor includes a linear expansion coefficient of about 10 ppm/K or smaller at a temperature exceeding the glass-transition temperature. In other words, the glass epoxy substrate is in an expanded state when mounted using a junction material (for example, solder) (at a temperature between about 240° C. and about 260° C. inclusive), and abruptly contracts when cooled from this state. Thus, a large residual stress is applied to the multilayer ceramic capacitor in a compression direction. Accordingly, cracks are generated in the multilayer ceramic capacitor because the stress due to the difference in the linear expansion coefficients of the laminated body and the circuit board is not sufficiently absorbed by the elastic external electrodes. As a result, cracks are generated in the multilayer ceramic capacitor when the conventional technology is used. core The mounting structure 10 of a multilayer ceramic capacitor according to the present preferred embodiment includes the copper plate 104 including the predetermined thickness between the multilayer ceramic capacitor 20 and the core 102 of the circuit board 100, and thus the residual stress generated when mounting the multilayer ceramic structure 20 on the circuit board 100 is significantly reduced. This is because Cu includes a linear expansion coefficient smaller than that of the glass epoxy substrate at a temperature between room temperature and a reflow mounting temperature. Specifically, the linear expansion coefficient of Cu is stable at no less than about 16 ppm/K and no more than about 18 ppm/K, for example. Accordingly, in a thermal impact cycle, the stress applied to the multilayer ceramic capacitor 20 due to the difference between the linear expansion coefficients of the laminated body 30 and the circuit board 100 is reduced such that the stress is absorbed or substantially absorbed by the first external electrode 50a and the second external electrode 50b that each include significantly increased elasticity. In addition, Cu provides excellent conductivity. Thus, in the configuration described above, the mounting structure 10 of a multilayer ceramic capacitor according to the present preferred embodiment significantly reduces or prevents the generation of cracks.

In the mounting structure 10 of a multilayer ceramic capacitor according to the present preferred embodiment, each of the first external electrode 50a and the second external electrode 50b and the signal electrodes 106 are connected with each other through the junction material 120 that may include solder. This configuration significantly simplifies mounting of the multilayer ceramic capacitor 20 on the circuit board 100. In addition, cracks generated in the junction material 120 are significantly reduced. Accordingly, the generation of cracks in the laminated body 30 are significantly reduced as well.

In the mounting structure 10 of a multilayer ceramic capacitor according to the present preferred embodiment, the predetermined thickness of the copper plate 104 is no less than about 80 μm and no more than about 600 μm, for example. This configuration leads to a significant reduction in the generation of cracks in the mounting structure 10.

The multilayer ceramic capacitor 20 included in the mounting structure 10 of a multilayer ceramic capacitor according to the above-described preferred embodiment will be described as an exemplary method of manufacturing a multilayer ceramic capacitor included in the multilayer-ceramic-capacitor mounting structure according to a preferred embodiment of the present invention.

First, the laminated body in which the first internal electrode layers, the second internal electrode layers, and the ceramic layers are laminated is prepared. A specific description is as follows.

First, ceramic paste including ceramic powder is applied in a sheet or substantially sheet shape by, for example, a screen printing method and dried to provide a ceramic green sheet.

Next, conductive paste for forming an internal electrode layer is applied in a predetermined pattern onto a surface of the ceramic green sheet by, for example, the screen printing method to provide a ceramic green sheet on which a conductor pattern for forming an internal electrode layer is formed. In addition, a ceramic green sheet on which no conductor pattern for forming an internal electrode layer is provided. The ceramic paste and the conductive paste for forming an internal electrode layer include, for example, a well-known binding agent or solvent.

Then, a predetermined number of the ceramic green sheets on which no conductor pattern for forming an internal electrode layer is provided are laminated, and then, the ceramic green sheet on which a conductor pattern for forming an internal electrode layer is provided is sequentially laminated on a surface of the ceramic green sheets, and a predetermined number of the ceramic green sheets on which no conductor pattern for forming an internal electrode layer is provided are laminated on the surface of the ceramic green sheet. In this manner, a mother laminated body is manufactured.

In addition, the mother laminated body may be pressed in the T direction as necessary by, for example, isostatic press.

Next, the mother laminated body is cut into a predetermined shape and a dimension to manufacture a plurality of raw laminated bodies. Each raw laminated body is, for example, barrel polished to provide rounded or substantially rounded edges and corners.

Then, the raw laminated body is fired. The temperature for firing the raw laminated body is set appropriately depending on the ceramic material and the conductive material, and is, for example, no less than about 900° C. and no more than about 1300° C.

The above-described procedure manufactures a laminated body in which the opposing portions of the first internal electrode layer and the second internal electrode layer are extended inside of the fired laminated body, and the extended portions of the first internal electrode layer and the second internal electrode layer are extended to ends of the fired laminated body.

Then, conductive paste is applied on both end surfaces of the fired laminated body and baked to form the base electrode layers of the first external electrode and the second external electrode. The temperature for baking is preferably no less than about 700° C. and no more than about 900° C., for example.

Next, conductive resin paste including a thermosetting resin and a metal component is applied to cover each base electrode layer, then thermal processing is performed at a temperature of no less than about 150° C. and no more than about 300° C., for example, to thermally cure the conductive resin paste, thus forming a conductive resin layer. An atmosphere during thermal processing is preferably a $N_2$ atmosphere. Oxygen concentration is preferably about 100 ppm or smaller to significantly reduce scattering of the resin and oxidation of the metal component.

Finally, a plated layer is formed on a surface of the conductive resin layer. The plated layer includes a single-layer structure, a double-layer structure including, for example, a Ni plated layer and a Sn plated layer, or a structure including three layers or more.

In this manner, the multilayer ceramic capacitor 20 included in the multilayer-ceramic-capacitor mounting structure 10 according to the present preferred embodiment of the present invention is manufactured.

The following describes an exemplary experiment performed by the inventors to verify the effects of preferred embodiments of the present invention. In the exemplary experiment, 10 specimens were manufactured for each of Example 1 and Comparative Examples 1 to 3, and a thermal impact cycle test was performed on the specimens to calculate a solder crack development rate.

EXAMPLE 1

In Example 1, a multilayer ceramic capacitor was manufactured according to the above-described manufacturing method, and mounted on the circuit board according to the present invention through a junction material. Details of the multilayer ceramic capacitor, the circuit board, and the junction material in Example 1 are as follows.

Multilayer ceramic capacitor
Dimension (L×W×T): 3.2 mm×1.6 mm×1.6 mm
Ceramic material: $BaTiO_3$
Capacitance: 10 μF
Rated voltage: 25 V
External Electrode Structure
Base electrode layer: electrode including a conductive metal (Cu) and a glass component and including a thickness of about 5 μm
Conductive resin layer: including a metal component (Ag), an epoxy-based thermosetting resin, a thermal curing temperature of about 200° C., and a thickness of about 70 μm
Plated layer: including a double-layer structure including a Ni plated layer (thickness about 3 μm) and a Sn plated layer (thickness about 5 μm)

Circuit Board

Core: glass epoxy substrate (thickness about 400 μm)

Copper plate: arranged on both surfaces of the core (each including a thickness of about 600 μm)

Signal electrode: Cu

Junction Material

Lead-free solder: Sn-3.0Ag-0.5Cu

Comparative Example 1

In Comparative Example 1, a multilayer ceramic capacitor provided with an external electrode including no conductive resin layer was manufactured and mounted on the circuit board according to a preferred embodiment of the present invention. Specifically, the multilayer ceramic capacitor in Comparative Example 1 was manufactured by forming a Ni plated layer on a surface of a base electrode layer and forming a Sn plated layer on a surface of the Ni plated layer. The multilayer ceramic capacitor in Comparative Example 1 includes a structure that is the same as that in Example 1 described above except that the multilayer ceramic capacitor in Comparative Example 1 includes no conductive resin layer. The circuit board in Comparative Example 1 includes a structure that is the same as that in Example 1 described above.

Comparative Example 2

In Comparative Example 2, a multilayer ceramic capacitor that is the same as that of Example 1 described above was manufactured and mounted on a conventional circuit board. Specifically, the circuit board in Comparative Example 2 was manufactured by arranging a Cu electrode including a thickness of about 50 μm on a surface of a glass epoxy substrate including a thickness of about 1500 μm.

Comparative Example 3

In Comparative Example 3, a multilayer ceramic capacitor that is the same as that of Comparative Example 1, which is provided with an external electrode including no conductive resin layer, was manufactured and mounted on a conventional circuit board that is the same as that of Comparative Example 2

Thermal Impact Cycle Test

The specimens of Example 1 and Comparative Examples 1 to 3 were each subjected to about 3000 repetitions of thermal impact cycle testing at temperatures no less than about −55° C. and no more than about 125° C. to verify the solder crack development rate.

Method of Checking Solder Crack Development Rate

Figure 6:
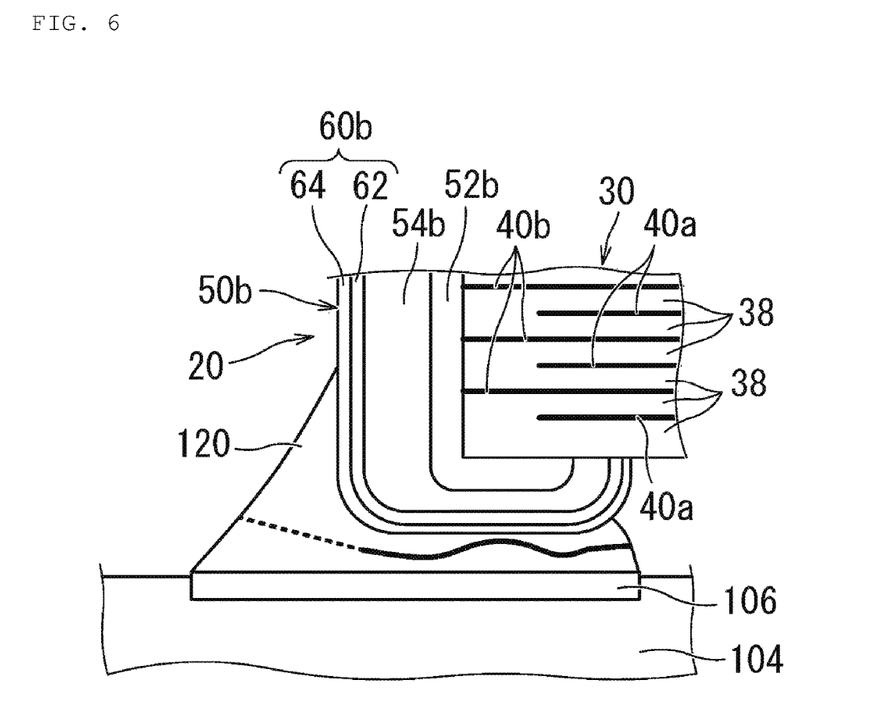
FIG. 6 is a pattern diagram of a method of checking for solder cracks in an exemplary experiment performed by the inventors to verify an effect of a preferred embodiment of the present invention.

A method of verifying the solder crack development rate that was performed after the thermal impact cycle test will be described below with reference to FIG. 6. FIG. 6 is a pattern diagram of a method of verifying any solder cracks in the exemplary experiment performed by the inventors to verify the effects of preferred embodiments of the present invention.

First, the specimens of Experiment Example 1 and Comparative Examples 1 to 3 subjected to the thermal impact cycle test were each provided with resin curing while being mounted on the circuit board, and polished until a dimension between side surfaces in the W direction were halved.

Next, measurements were taken of the length of a solder crack (the length of a part illustrated with a solid line inside solder in FIG. 6; hereinafter referred to as a "solid-line length"), and the length of a shortest path from a leading end of the solder crack to the outer edge of the solder (the length of a part illustrated with a dashed line inside the solder in FIG. 6; hereinafter a "dashed-line length").

Then, the solder crack development rate was calculated using the formula: (the solid-line length/the solid-line length+the dashed-line length)×100%. The development rate was calculated for the solder of the first external electrode and the solder of the second external electrode, and a larger value was set as the solder crack development rate of the specimen.

Finally, a development rate averaged over the 10 specimens of Example 1, a development rate averaged over the 10 specimens of Comparative Example 1, a development rate averaged over the 10 specimens of Comparative Example 2, and a development rate averaged over the 10 specimens of Comparative Example 3 were calculated. In this manner, the development rate of Example 1, the development rate of Comparative Example 1, the development rate of Comparative Example 2, and the development rate of Comparative Example 3 were calculated.

Result of Exemplary Experiment

Table 1 lists a result of the exemplary experiment.

TABLE 1

| Specimen | Conductive resin layer | Copper plate | Solder crack development rate (%) |
|---|---|---|---|
| Example 1 | Yes | Yes | 44.31 |
| Comparative Example 1 | No | Yes | 96.12 |
| Comparative Example 2 | Yes | No | 93.32 |
| Comparative Example 3 | No | No | 98.13 |

As indicated in Table 1, the solder crack development rate of Example 1 was about 44.31%. The solder crack development rate of Comparative Example 1 was about 96.12%, the solder crack development rate of Comparative Example 2 was about 93.32%, and the solder crack development rate of Comparative Example 3 was about 98.13%. Thus, the generation of cracks was significantly reduced in Example 1 as compared to Comparative Examples 1 to 3. In other words, the generation of cracks is significantly reduced when the first external electrode and the second external electrode of the multilayer ceramic capacitor include conductive resin layers and the copper plate including the predetermined thickness is provided between the multilayer ceramic capacitor and the core of the circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer-ceramic-capacitor mounting structure comprising:
    a circuit board; and
    a multilayer ceramic capacitor mounted on the circuit board; wherein
        the multilayer ceramic capacitor includes:
        a laminated body with a rectangular parallelepiped or substantially rectangular parallelepiped shape in which a plurality of ceramic layers and a plurality of internal electrode layers are laminated, a pair of principal surfaces facing each other in a lamination direction of the laminated body, a pair of side surfaces facing each other in a width direction perpendicular or substantially perpendicular to the lamination direction, and a pair of end surfaces facing each other in a length direction perpendicular or substantially perpendicular to the lamination direction and the width direction; and a pair of external electrodes on a surface of the laminated body and electrically connected to the plurality of internal electrode layers; wherein the pair of external electrodes each include a base electrode layer including a conductive metal and a glass component, a conductive resin layer on a surface of the base electrode layer and including a thermosetting resin and a metal component, and a plated layer on a surface of the conductive resin layer; and the circuit board includes:

a core with a flat or substantially flat plate shape;

a copper plate on a surface of the core, defining a wiring pattern, and including a predetermined thickness; and signal electrodes disposed on a surface of the copper plate; wherein the pair of external electrodes of the multilayer ceramic capacitor are each electrically connected to the signal electrodes of the copper plate;

the signal electrodes are plated layers; and the predetermined thickness is no less than about 80 μm and no more than about 600 μm.

2. The multilayer-ceramic-capacitor mounting structure according to claim 1, wherein the pair of external electrodes of the multilayer ceramic capacitor are each connected to the signal electrodes of the copper plate through a junction material.

3. The multilayer-ceramic-capacitor mounting structure according to claim 1, wherein the metal component of the conductive resin layer of each of the pair of external electrodes includes at least one of Ag, Cu, an alloy thereof, and an Ag coated metal powder.

4. The multilayer-ceramic-capacitor mounting structure according to claim 1, wherein the copper plate includes a first portion that is closer to one of the pair of external electrodes and a second portion that is closer to the other one of the pair of external electrodes on the surface of the circuit board on which the multilayer ceramic capacitor is mounted.

5. The multilayer-ceramic-capacitor mounting structure according to claim 1, wherein each plated layer of the pair of external electrodes includes two or more plated layers.

6. The multilayer-ceramic-capacitor mounting structure according to claim 2, wherein the junction material covers only a portion of the pair of external electrodes and an entire surface of each of the signal electrodes.

7. The multilayer-ceramic-capacitor mounting structure according to claim 3, wherein the metal component of the conductive resin layer of each of the pair of external electrodes includes the Ag coated metal powder.

8. The multilayer-ceramic-capacitor mounting structure according to claim 2, wherein the junction material includes Sn, Ag, Cu, Pb, Sb, or Bi.

9. A multilayer-ceramic-capacitor mounting structure comprising:

a circuit board; and a multilayer ceramic capacitor mounted on the circuit board; wherein the multilayer ceramic capacitor includes:

a laminated body with a rectangular parallelepiped or substantially rectangular parallelepiped shape in which a plurality of ceramic layers and a plurality of internal electrode layers are laminated, a pair of principal surfaces facing each other in a lamination direction of the laminated body, a pair of side surfaces facing each other in a width direction perpendicular or substantially perpendicular to the lamination direction, and a pair of end surfaces facing each other in a length direction perpendicular or substantially perpendicular to the lamination direction and the width direction; and a pair of external electrodes on a surface of the laminated body and electrically connected to the plurality of internal electrode layers; wherein the pair of external electrodes each include a base electrode layer including a conductive metal and a glass component, a conductive resin layer on a surface of the base electrode layer and including a thermosetting resin and a metal component, and a plated layer on a surface of the conductive resin layer; and the circuit board includes:

a core with a flat or substantially flat plate shape;

a copper plate on a surface of the core, defining a wiring pattern, and including a predetermined thickness; and signal electrodes disposed on a surface of the copper plate; wherein the pair of external electrodes of the multilayer ceramic capacitor are each electrically connected to the signal electrodes of the copper plate;

the signal electrodes are plated layers; and thicknesses of thickest portions of the base electrode layers are no less than about 10 μm and no more than about 50 μm.

10. The multilayer-ceramic-capacitor mounting structure according to claim 1, wherein the plated layers of the pair of external electrodes each include at least one of Cu, Ni, Sn, Ag, Pd, Ag—Pd alloy, and Au.

11. A multilayer-ceramic-capacitor mounting structure comprising:

a circuit board; and a multilayer ceramic capacitor mounted on the circuit board; wherein the multilayer ceramic capacitor includes:

a laminated body with a rectangular parallelepiped or substantially rectangular parallelepiped shape in which a plurality of ceramic layers and a plurality of internal electrode layers are laminated, a pair of principal surfaces facing each other in a lamination direction of the laminated body, a pair of side surfaces facing each other in a width direction perpendicular or substantially perpendicular to the lamination direction, and a pair of end surfaces facing each other in a length direction perpendicular or substantially perpendicular to the lamination direction and the width direction; and a pair of external electrodes on a surface of the laminated body and electrically connected to the plurality of internal electrode layers; wherein the pair of external electrodes each include a base electrode layer including a conductive metal and a glass component, a conductive resin layer on a surface of the base electrode layer and including a thermosetting resin and a metal component, and a plated layer on a surface of the conductive resin layer; and the circuit board includes:

a core with a flat or substantially flat plate shape;

a copper plate on a surface of the core, defining a wiring pattern, and including a predetermined thickness; and signal electrodes disposed on a surface of the copper plate; wherein the pair of external electrodes of the multilayer ceramic capacitor are each electrically connected to the signal electrodes of the copper plate;

the signal electrodes are plated layers; and a thickness of each layer included in the plated layers of the pair of external electrodes is no less than about 1 μm and no more than about 15 μm.

12. The multilayer-ceramic-capacitor mounting structure according to claim 1, wherein each of the plated layers of the pair of external electrodes includes a Ni plated layer and a Sn plated layer; and the Sn plated layer covers the Ni plated layer.

* * * * *